United States Patent
Lim et al.

(10) Patent No.: US 6,281,954 B1
(45) Date of Patent: Aug. 28, 2001

(54) LIQUID CRYSTAL DISPLAY DEVICE AND METHOD FOR MANUFACTURING THE SAME

(75) Inventors: Kyoung Nam Lim, Seoul; Sung Il Park, Taeku-shi; Jeong Hyun Kim, Kyoungki-do, all of (KR)

(73) Assignee: LG. Philips LCD Co., Ltd., Seoul (KR)

( * ) Notice: Subject to any disclaimer, the term of this patent is extended or adjusted under 35 U.S.C. 154(b) by 0 days.

(21) Appl. No.: 09/442,632

(22) Filed: Nov. 18, 1999

(51) Int. Cl.[7] ............... G02F 1/136; G02F 1/13; H01L 29/04
(52) U.S. Cl. ................ 349/43; 349/187; 257/59
(58) Field of Search ............... 349/42, 43, 41, 349/187; 257/59, 72

(56) References Cited

U.S. PATENT DOCUMENTS 5,084,905 * 1/1992 Sasaki et al. ............ 349/43
5,414,278 * 5/1995 Kovayashi et al. ............ 257/72
5,943,105 * 8/1999 Fujikawa et al. ............ 257/57

* cited by examiner

Primary Examiner—Toan Ton
(74) Attorney, Agent, or Firm—Long Aldridge & Norman LLP

(57) ABSTRACT

The present invention is to provide a manufacturing method and a structure of an LCD which prevents a pixel electrode from being disconnected or being peeled off thinly from the drain electrode. The bottom plate of an active matrix type LCD comprises a protection layer which covers the switching element, a contact hole for exposing the output terminal of the switching element through the protection layer and the pixel electrode which contacts the output terminal of the switching element through the contact hole and which is formed on the protection layer. Specifically, the contact hole is located in a distance of at least 5 μm inwards from the edge of the pixel electrode. Therefore, disconnection or peel off of the pixel electrode from the drain electrode due to cracking of the pixel electrode occurring during the process of baking at a high temperature is prevented.

21 Claims, 6 Drawing Sheets

LIQUID CRYSTAL DISPLAY DEVICE AND METHOD FOR MANUFACTURING THE SAME

CROSS REFERENCE TO RELATED ART

This application incorporates by reference Korean Laid Open Application No. 1997-42242, filed Aug. 28, 1997.

BACKGROUND OF THE INVENTION

1. Field of the Invention

The present invention relates to a structure and manufacturing method of a TFT type liquid crystal display, and particularly, to a TFT designed to prevent a drain electrode from being disconnected from a pixel electrode.

2. Description of Related Art

Figure 1A:
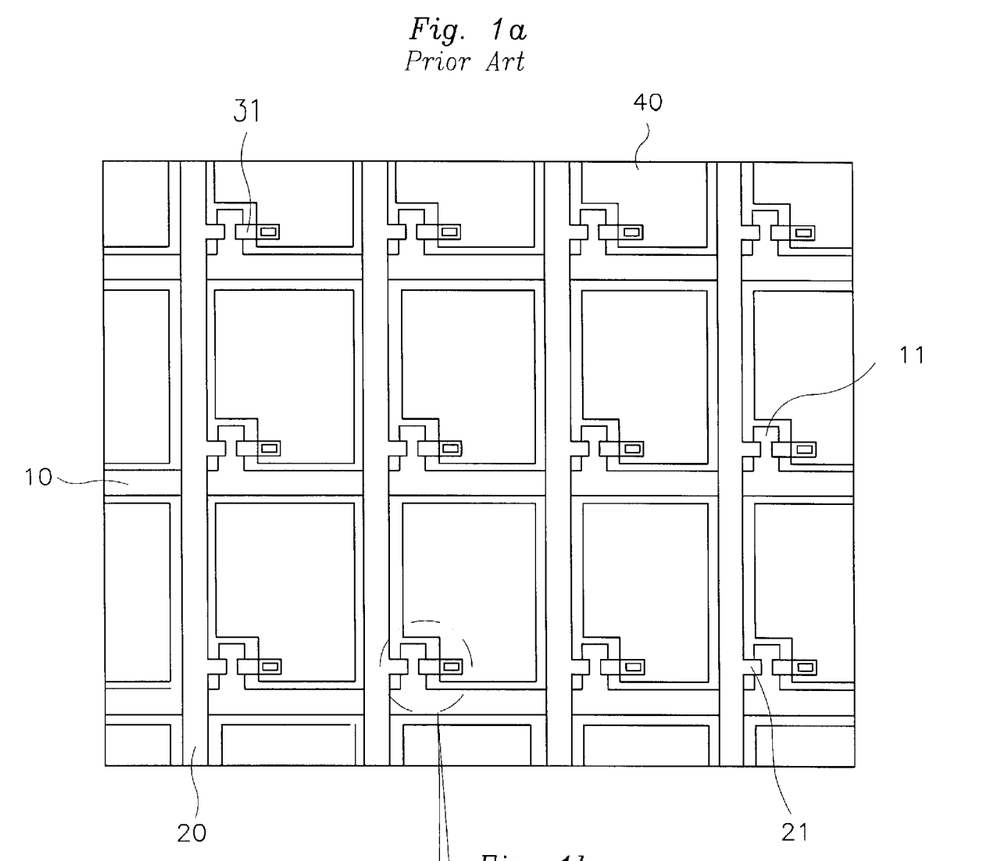
FIG. 1a is a plan view of a conventional structure of the bottom plate of an LCD.
Figure 1B:
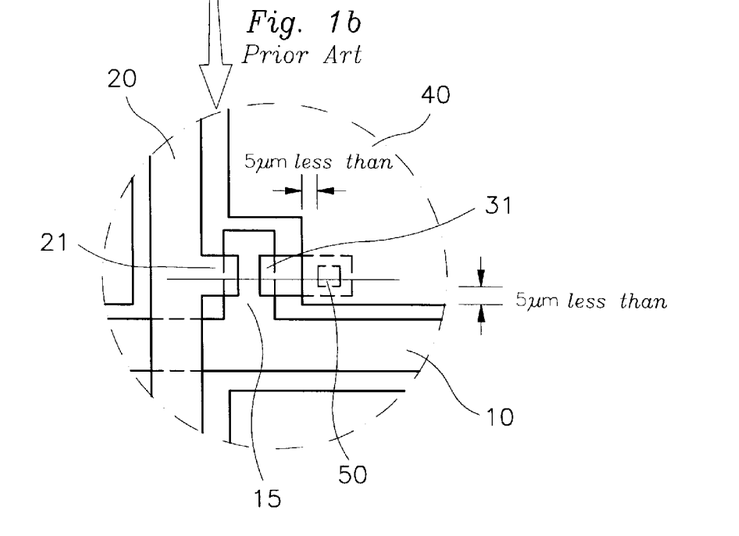
FIG. 1b is an enlarged view of a part of the bottom plate of a conventional LCD.

In general, a TFT type LCD comprises a bottom plate, an upper plate and a liquid crystal which is filled in between the two plates. A polarizing plate which polarizes a visible ray so that only one aspect of the ray could be seen is attached at both sides of the two plates. A polarizing plate is attached at one side, and a color filter and a common electrode are formed on the other side of the upper plate. A plurality of gate bus lines 10 and a data bus line 20 are in a matrix form and on a certain space formed by the crossing of a plurality of gate bus lines 10 and a data bus line. A pixel electrode 40 is located in the structure of the bottom plate. Structure of the bottom plate of the active matrix type LCD is illustrated hereafter with reference to FIGS. 1a and 1b.

A plurality of gate bus lines 10 is formed horizontally on the bottom plate of the LCD, and a gate electrode 11 is formed by deriving from the gate bus line 10. A plurality of data bus lines 20 is formed perpendicularly to each of the gate bus line 10, and a source electrode 21 is formed by deriving from the data bus line 20. The switching element of the TFT structure comprises a gate electrode 11, a source electrode 21 and a drain electrode 31 by forming the drain electrode 31 opposite to the source electrode 21. The manufacturing step of the bottom plate of the active matrix type LCD is illustrated below with reference to FIGS. 2a to 2f.

Figure 2A:
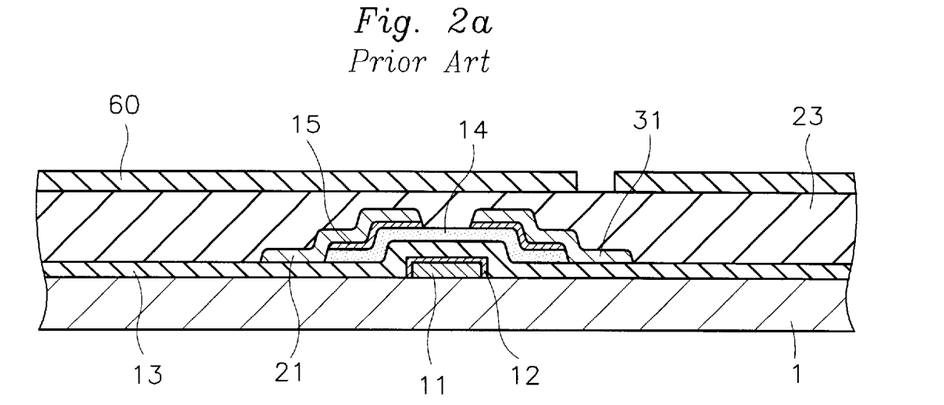
FIGS. 2a to 2f are plan views of the manufacturing process of the bottom plate of a conventional LCD.

Bottom plate or substrate 1 is formed with a glass substrate. A gate electrode 11, which is derived from the gate bus line, is formed through patterning on the bottom plate 1. A gate anodizing layer 12 is formed on the gate electrode 11. A gate insulating layer 13 is deposited on the bottom plate 1 where the gate anodizing layer 13 is formed. A gate insulating layer 13 is then formed with SiNx, SiOx and the like which have good interfacial property with a-Si, good adhesiveness with the gate electrode 11 and the bottom plate 1 and a high insulating characteristic. A semiconductor layer 14 is formed by depositing a-Si which has a high moving density of carrier on the gate insulating layer 13. An ohmic contact layer 15 is formed on the semiconductor layer 14 for satisfactory ohmic contact between source electrode 21 and drain electrode 31. A Ti metal layer is applied on the entire surface of the bottom plate 1 by a sputtering method and then the data bus line 20 which acts as a signal line, source electrode 21 which is derived from data bus line 20 and drain electrode 31 which acts as an output terminal located opposite to the source electrode 21 are formed by patterning the Ti metal layer. The switching element of TFT structure comprising gate electrode 11, semiconductor layer 14, source electrode 21 and drain electrode 31 is formed through the sequential steps mentioned above.

A protection layer 23 is formed by applying an organic insulating layer, such as BCB and the like, on the switching element. Referring to FIG. 2a, photo resister 60 is developed into a certain pattern by exposing with mask after applying photo resister 60 on the protection layer 23 using a spin coating method.

Figure 2B:
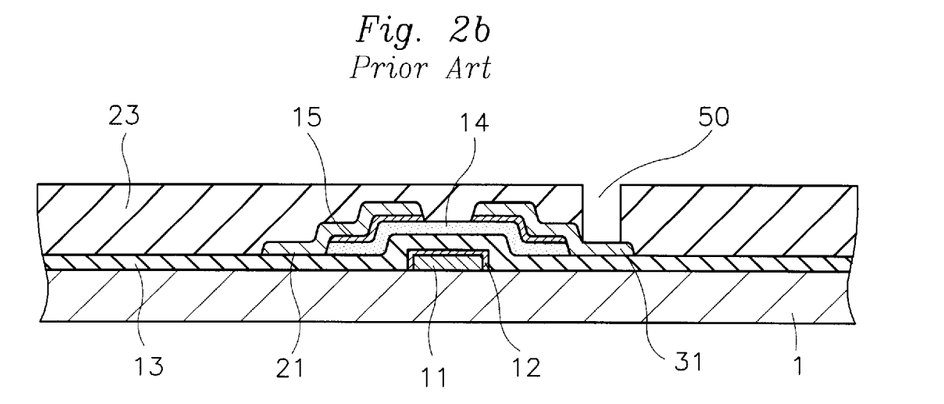

The bottom plate 1, including photo resister 60 which is developed into a certain pattern, is etched by plasma gas like $SF_6/O_2$ or $CF_4/O_2$ inside the etching chamber and, through this process, a part of the protection layer 23 is eliminated. The photo resister 60 on the protection layer 23 is concurrently eliminated by ashing with $O_2$ gas. Therefore, a contact hole 50, which is exposed through the place where drain electrode 31 and protection layer 23, are partly eliminated as shown in FIG. 2b.

Figure 2C:
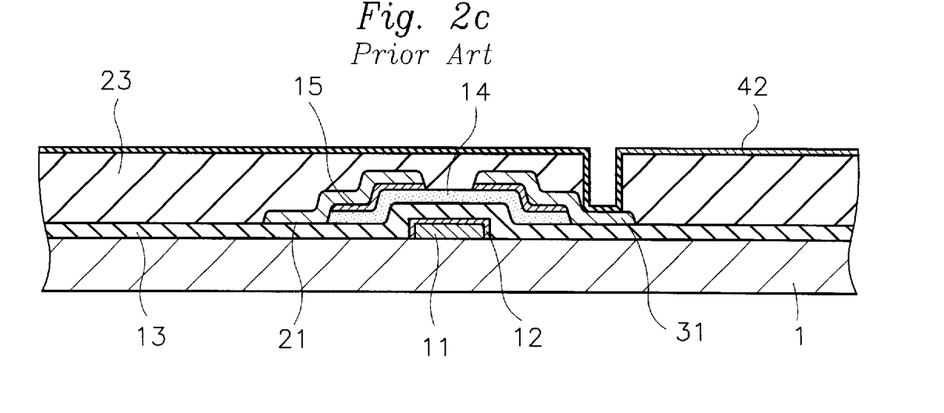

An ITO layer 42 is deposited on the entire surface of the protection layer 23 where the contact hole is formed by a sputtering method as shown in FIG. 2c.

Figure 2D:
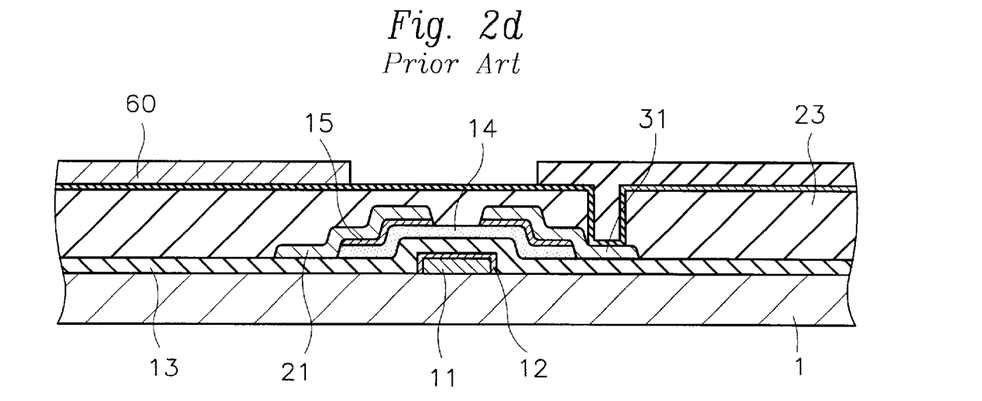

Another photo resister 60 is applied on the ITO layer 42 by a spin coating method. By exposing the spin coated photo resister 60 using a mask, it is developed into a certain pattern as shown in FIG. 2d.

Figure 2E:
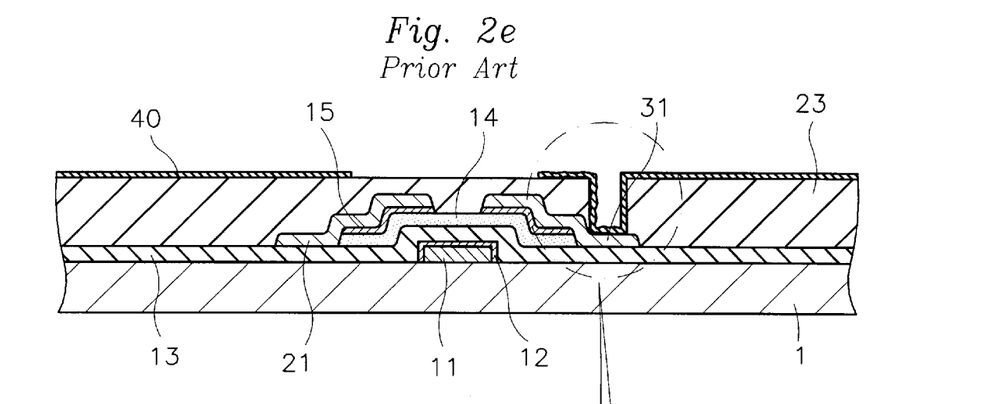
Figure 2F:
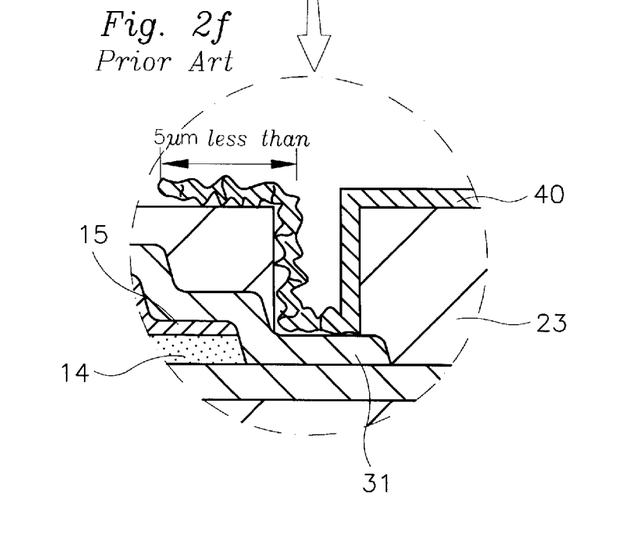

The pixel electrode 40 is then formed by etching the bottom plate 1 which includes photo resister 60 developed into a certain pattern with etching solution like HCl. The photo resister 60 remaining on the pixel electrode 40 is eliminated by using an organic solution which is a mixture of NMP{N-Methyl-Pyrrolidone), alcohol and amine. The pixel electrode 40 which is in contact with drain electrode 31 through contact hole 50 is formed as a result as shown in FIG. 2e.

An orientation layer with a polyimide layer and the like is applied on the entire surface of the bottom plate of the LCD which includes a plurality of switching elements and pixel electrodes 40 that are formed through sequential steps illustrated in FIGS. 2a–2f and described above. The manufacturing step of the bottom plate 1 of the LCD is carried out by using a baking method which is a heat treatment of high temperature approximately 150~200° C. at the bottom plate of the LCD where the orientation layer is applied.

SUMMARY OF THE INVENTION

Accordingly, the present invention is directed to a liquid crystal device that substantially obviates one or more of the problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

Pixel electrode 40 is formed by developing photo resister 60 into a certain pattern on an ITO layer and etching the ITO layer with etching solution like HCl along the developed pattern at the stage where the ITO layer is applied on the switching element which is covered with a protection layer 23 including a contact hole 50 and the ITO layer is etched according to a conventional manufacturing method and structure of the bottom plate of an LCD. Furthermore, organic solution which is a mixture of NMP, alcohol and amine is used to eliminate photo resister 60 in which an ITO layer is applied and in order to form an orientation layer on the bottom plate of the LCD, a baking process of high temperature is carried out after polyimide layer is applied.

During this process, an etching solution like HCl is used in the etching process of the ITO layer and an organic solution which is a mixture of NMP, alcohol and amine is used in the process of eliminating photo resister 60 remaining at the edge part $S_1$ of pixel electrode 40 during the etching process or etching solution which penetrates between pixel electrode 40 and protection layer 23 through the edge part Si as shown in FIG. 2e. So, if a hard baking process of high temperature is carried out after applying polyimide layer on the entire surface of the bottom plate in which pixel electrode 40 is formed, swelling occurs due to thermal expansion of protection layer 23 of the bottom plate. In addition, cracking occurs at the edge of pixel electrode 40 as an area where pixel electrode 40 is on protection layer 23; the area where there is no pixel electrode 40 on protection layer 23 receives a different pressure due to swelling of protection layer 23. swelling of protection layer 23 and cracking of pixel electrode 40 obstructs contact between drain electrode 31 and pixel electrode 40 through the contact hole 50 of protection layer 23 and this leads to the problem of contact between drain electrode 31 and pixel electrode 40 being disconnected or being peeled off thinly.

The present invention is to overcome problems of conventional LCD by locating contact hole 50 5 μm or more inwards from the edge of pixel electrode 40 so that contact between drain electrode 31 and pixel electrode 40 is not obstructed by swelling of protection layer 23 and cracking of pixel electrode 40 and to provide a structure and manufacturing method accordingly.

It is to be understood that both the foregoing general description and the following detailed description are exemplary and explanatory and are intended to provide further explanation of the invention as claimed.

BRIEF DESCRIPTION OF ATTACHED DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE PREFERRED EMBODIMENTS

The bottom plate structure of the LCD of the present invention comprises a switching element, a protection layer which covers the switching element, a pixel electrode which is formed on the protection layer, and a contact hole which is formed at least 5 μm inwards from the edge of the pixel electrode for contacting the output terminal of the switching element and the pixel electrode. The protection layer is an organic insulating layer like BCB. Other suitable insulators known to one of ordinary skill in the art may be substituted. The switching element is a structure of a TFT type acting as an output terminal including a drain electrode. The drain electrode of the switching element is located at least 5 μm inwards from the location of the pixel electrode in order to contact the pixel electrode through the contact hole.

Furthermore, the present invention especially characterizes in locating the contact hole at least 5 μm inwards from the edges of the pixel electrode in the process of forming the switching element on a substrate, forming the protection layer which covers the output terminal of the switching element and forming a pixel electrode which is formed on the protection layer which is an organic insulating layer selected from BCB, Fluorinated polyimide, tetrafluoroethylene fluorocarbon polymer (also known as trademark name "Teflon"), Cytop, Fluoropoly-arylether and Fluorinated para-xylene.

A detailed description of the present invention is illustrated hereafter with reference to FIGS. 3 and 4a–4f which are an enlarged view of a part of the bottom plate and a plan view of manufacturing steps of the bottom plate.

Figure 3:
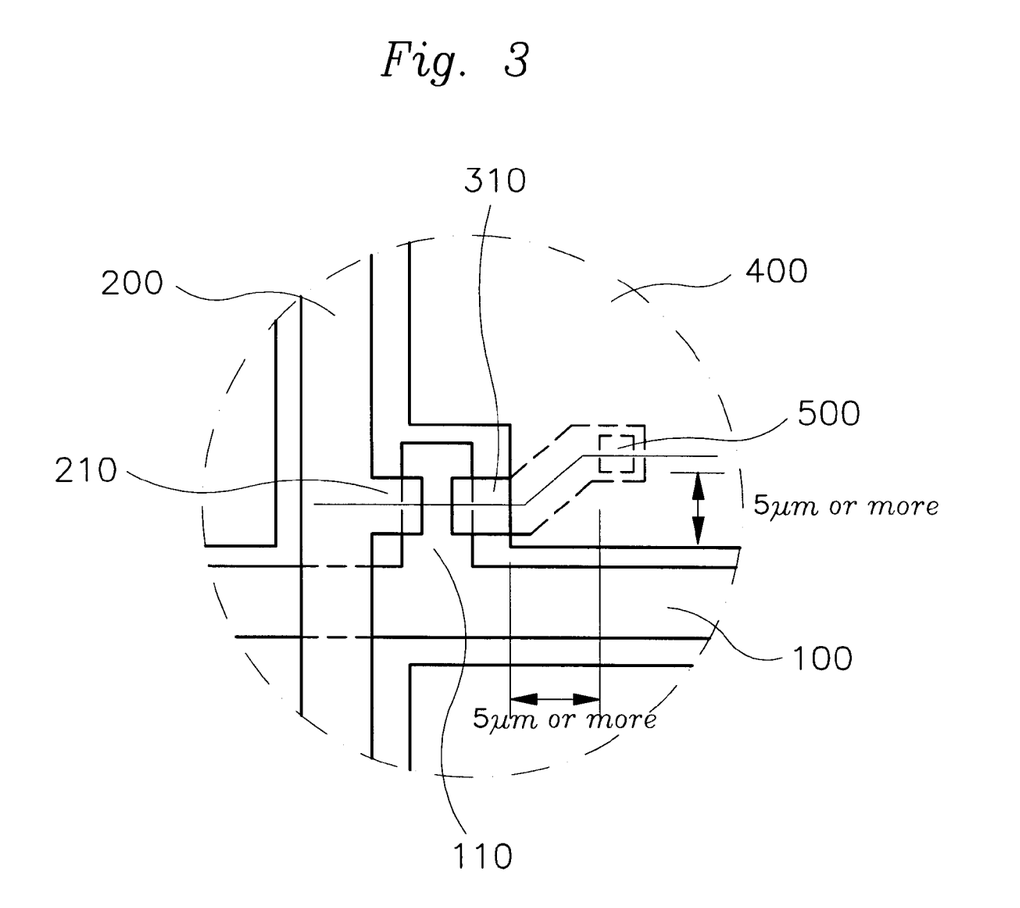
FIG. 3 is an enlarged view of a part of an active matrix type LCD according to the preferred embodiment of the present invention.

The bottom plate 111 has a structure of gate bus line 100 and data bus line 200 crossing each other and includes a switching element and a pixel electrode 400 which is located at the section where the gate bus line and the data bus line cross as shown in FIG. 3. The switching element of the bottom plate 111 includes a protection layer 230 which covers the switching element, a contact hole 500 which is formed on the protection layer 230 and a pixel electrode 400 which is formed on the protection layer 230 including a contact hole 500. The pixel electrode 400 contacts the output terminal of the switching element, which is located at the lower end of the protection layer 230, through the contact hole 500 as shown in FIGS. 4a to 4f. The contact hole 500 is located at least 5 μm inwards of the pixel electrode 400 from the edges of the pixel electrode 400. The output terminal of the switching element is located opposite to source electrode 21 which is derived from data bus line 200. In order to contact the pixel electrode 400 through the contact hole 500, the output terminal of the switching element is at least 5 μm inwards the location of the pixel electrode 400. A manufacturing method and a structure of the present invention which is comprised as mentioned above is described hereafter with reference to FIGS. 4a to 4f.

Figure 4A:
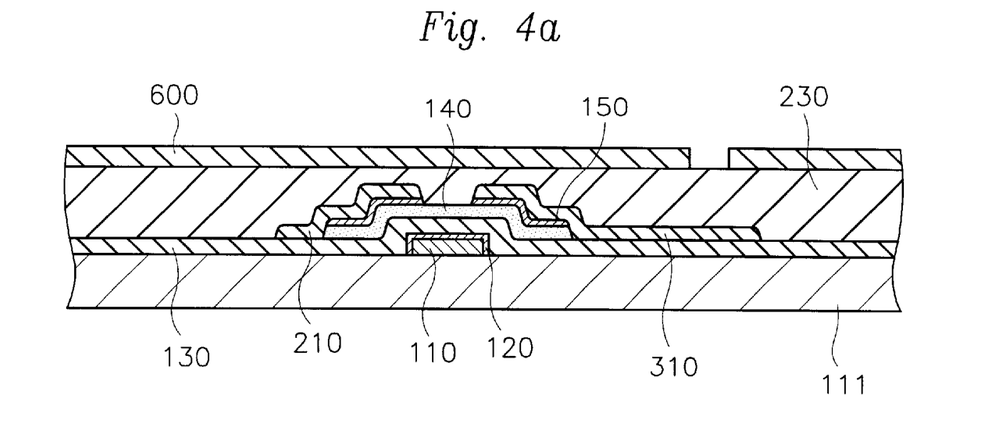
FIGS. 4a to 4f are plan views of the manufacturing process of the bottom plate according to the present invention.

The bottom plate 111 is preferably formed with glass substrate. Gate electrode 110, semiconductor layer 140, source electrode 210 and the switching element of a TFT structure are formed on the bottom plate 111. The drain electrode 310 which is used as output terminal of the switching element extends at least 5 μm inwards of the pixel electrode 400 (shown in FIG. 3) which is to be in contact with the drain electrode 310. The protection layer 230 which is formed from an organic insulating layer like BCB as illustrated in table 1 is applied on the bottom plate 111 including the switching element. The photo resister 600 is applied on the bottom plate of the LCD where the protection layer 230 is applied by a spin coating method. Then photo resister 600 is developed into a certain pattern by exposing using a mask as shown in FIG. 4a.

TABLE 1

Dielectric constant of organic materials

| organic material | Dielectric constant | Structure |
|---|---|---|
| Fluorinated polyimide | 2.7 | |
| Teflon | 2.1~1.9 | |
| Cytop | 2.1 | |
| BCB | ~2.6 | (two alternative structures shown) |
| Fluoropoly arylether | 2.6 | |
| Fluorinated para-xylene | ~2.4 | |

Figure 4B:
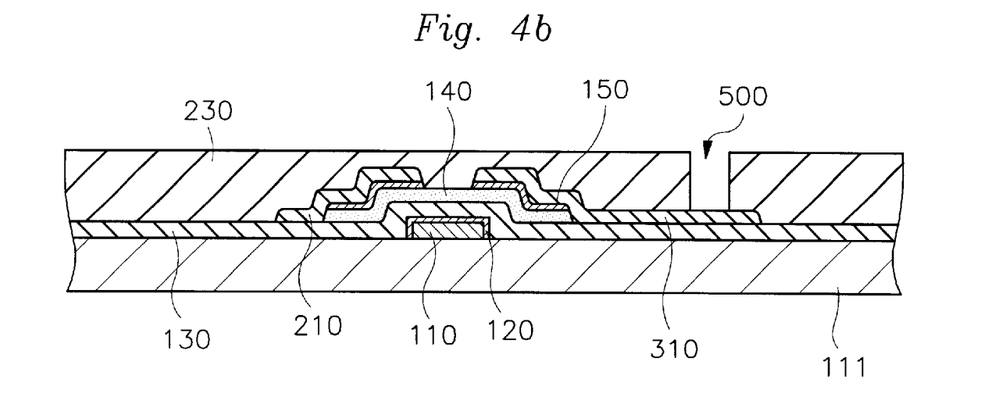

The contact hole 500 is formed as a part of the protection layer 230. The bottom plate 111 is selectively etched in accordance with the shape of the photo resistor 600. Such process is carried out in a dry etching chamber with plasma gas like $SF_6/O_2$ or $CF_4/O_2$. In order to expose the drain electrode 310 which is an output terminal of a switching element through the contact hole 500, a contact hole 500 is formed at least 5 μm inwards the edge of the planned location of the pixel electrode and photo resistor 600 on the protection layer is eliminated by ashing with $O_2$ at the same time as the etching process as shown in FIG. 4b.

Figure 4C:
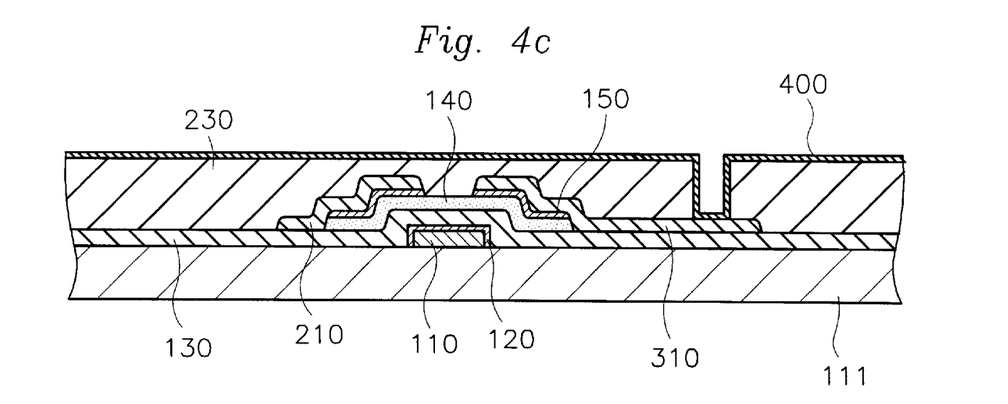
Figure 4D:
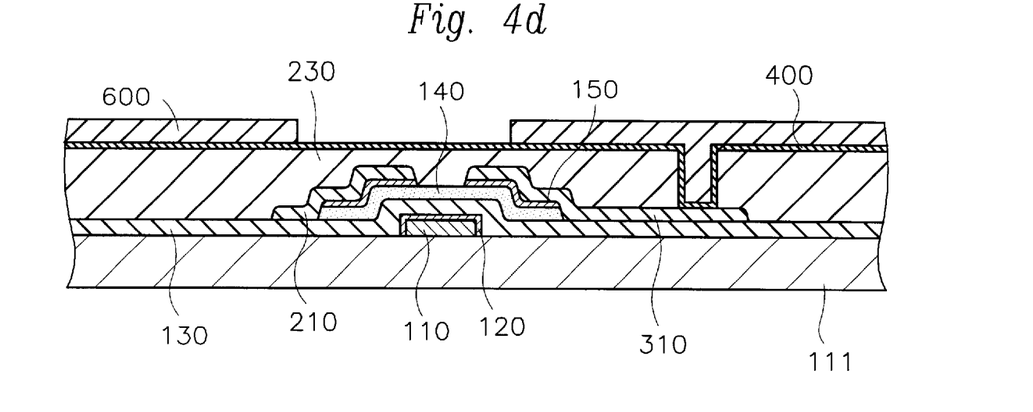

An ITO layer 400 is deposited on the entire surface of protection layer 230 where the contact hole 500 is formed by a sputter method as shown in FIG. 4c. Thereafter, the photo resister 600 is applied by a spin coating method on an ITO layer and spin coated photo resister 600 is developed into a certain pattern by exposure using a mask as shown in FIG. 4d.

Figure 4E:
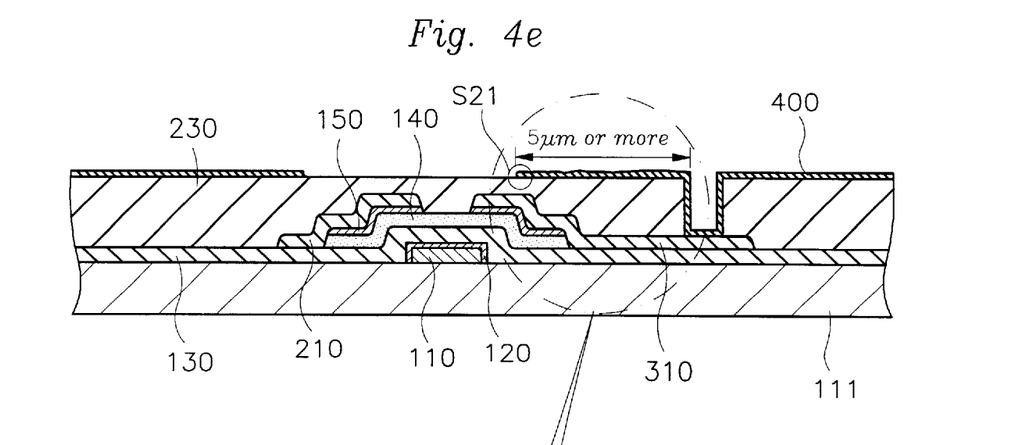
Figure 4F:
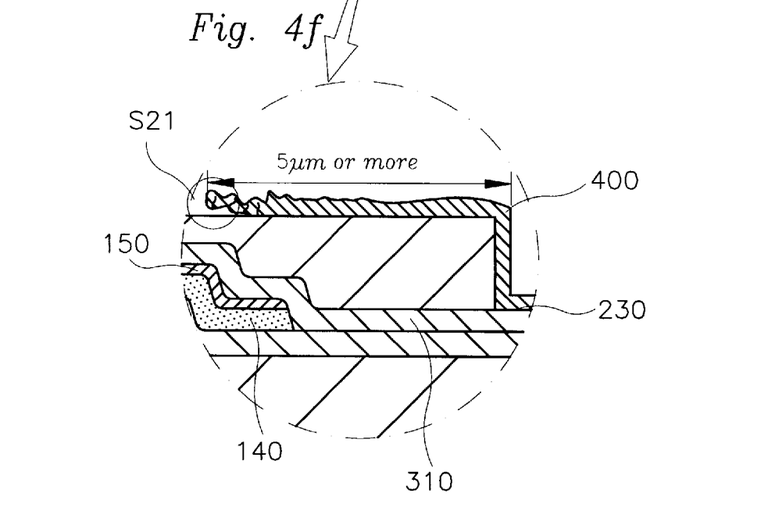

The pixel electrode 420 is formed by etching the bottom plate which includes photo resister 600 developed into a certain pattern with an etching solution like HCI. A pixel electrode 420 which is joined with the drain electrode 310 through the contact hole 500 is formed by eliminating photo resister 600 remaining on the pixel electrode 400 with an organic solution which is a mixture of NMP, alcohol and amine as shown in FIG. 4e. Accordingly, the edge of pixel electrode 400 is located in a distance of 5 μm or more from the contact hole 500. As described through the preferred embodiment above, the bottom plate of the LCD as manufactured and structured according to the present invention, the contact surface between contact hole 500 and the pixel electrode 400 is broadened at least more than 5 μm. Therefore, the bottom plate of the LCD of the present invention has the effect of preventing disconnection or peel off between pixel electrode 400 and drain electrode 310 through contact hole 500 due to cracking which usually occurs at the edge $S_{21}$ of the pixel electrode 400.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An active matrix type LCD including a switching element, the LCD comprising:
    a protection layer disposed above the switching element;
    a pixel electrode formed at least partially on the protection layer; and
    a contact hole for connecting an output terminal of the switching element and the pixel electrode, wherein the contact hole is formed at least 5 μm inwards from an edge of the pixel electrode.

2. The LCD according to claim 1, wherein the output terminal of the switching element is located at a lower part of the contact hole for being connected with the pixel electrode through the contact hole.

3. The LCD according to claim 1, wherein the protection layer is an organic insulating layer.

4. The LCD according to claim 3, wherein the organic insulating layer is at least one of BCB, Fluorinated polyimide, Tetrafluoroethylene fluorocarbon polymer, Cytop, Fluoropoly-arylether and Fluorinated para-xylene.

5. The LCD according to claim 1, wherein the contact hole is formed at least 5 μm inwards from all edges of the pixel electrode.

6. The LCD according to claim 2, wherein the protection layer is an organic insulating layer.

7. The LCD according to claim 6, wherein the organic insulating layer is at least one of BCB, Fluorinated polyimide, Tetrafluoroethylene fluorocarbon polymer, Cytop, Fluoropoly-arylether and Fluorinated para-xylene.

8. An active matrix type LCD including a switching element, the LCD comprising:
    a protection layer disposed above the switching element;
    a pixel electrode formed at least partially on the protection layer; and
    a contact means for connecting an output terminal of the switching element and the pixel electrode, wherein the contact means is formed at least 5 μm inwards from an edge of the pixel electrode.

9. The LCD according to claim 8, wherein the output terminal of the switching element is located at a lower part of the contact means for being connected with the pixel electrode through the contact hole.

10. The LCD according to claim 8, wherein the protection layer is an organic insulating layer.

11. The LCD according to claim 10, wherein the organic insulating layer is at least one of BCB, Fluorinated polyimide, Tetrafluoroethylene fluorocarbon polymer, Cytop, Fluoropoly-arylether and Fluorinated para-xylene.

12. The LCD according to claim 8, wherein the contact means is formed at least 5 μm inwards from all edges of the pixel electrode.

13. The LCD according to claim 9, wherein the protection layer is an organic insulating layer.

14. The LCD according to claim 10, wherein the organic insulating layer is at least one of BCB, Fluorinated polyimide, Tetrafluoroethylene fluorocarbon polymer, Cytop, Fluoropoly-arylether and Fluorinated para-xylene.

15. A method of manufacturing an active matrix type LCD including a switching element, the method comprising the steps of:
    forming a protection layer above the switching element;
    forming a pixel electrode at least partially on the protection layer; and
    forming a contact hole at least 5 μm inwards from an edge of the pixel electrode, wherein the contact hole is being used to connect an output terminal of the switching element and the pixel electrode.

16. The method according to claim 15, wherein the output terminal of the switching element is located at a lower part of the contact hole for being connected with the pixel electrode through the contact hole.

17. The method according to claim 15, wherein the protection layer is an organic insulating layer.

18. The method according to claim 17, wherein the organic insulating layer is at least one of BCB, Fluorinated polyimide, Tetrafluoroethylene fluorocarbon polymer, Cytop, Fluoropoly-arylether and Fluorinated para-xylene.

19. The method according to claim 15, wherein the contact hole is formed at least 5 μm inwards from all edges of the pixel electrode.

20. The method according to claim 16, wherein the protection layer is an organic insulating layer.

21. The method according to claim 20, wherein the organic insulating layer is at least one of BCB, Fluorinated polyimide, Tetrafluoroethylene fluorocarbon polymer, Cytop, Fluoropoly-arylether and Fluorinated para-xylene.

* * * * *